United States Patent
Loglisci et al.

(10) Patent No.: US 10,333,289 B2
(45) Date of Patent: Jun. 25, 2019

(54) SENSOR FOR MEASURING CURRENT OF THE ROGOWSKI-TORUS TYPE, PROTECTING AND MEASURING DEVICE AND ELECTRIC CIRCUIT BREAKER INCLUDING SUCH A SENSOR

(71) Applicant: Schneider Electric Industries SAS, Rueil-Malmaison (FR)

(72) Inventors: David Loglisci, Uriage (FR); Sebastien Buffat, Tullins (FR); Michel Rapeaux, Grenoble (FR); Stephane Sicard, Saint Jean de Vaulx (FR); Stephane Alban, La Terrasse (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 268 days.

(21) Appl. No.: 15/358,719

(22) Filed: Nov. 22, 2016

(65) Prior Publication Data
US 2017/0170645 A1  Jun. 15, 2017

(30) Foreign Application Priority Data
Dec. 15, 2015 (FR) .................................... 15 62390

(51) Int. Cl.
*H02H 3/08* (2006.01)
*G01R 15/18* (2006.01)
*H02H 1/00* (2006.01)

(52) U.S. Cl.
CPC ............ *H02H 3/08* (2013.01); *G01R 15/181* (2013.01); *H02H 1/0007* (2013.01)

(58) Field of Classification Search
CPC ....... H02H 3/08; H02H 1/0007; G01R 15/181

USPC ......................................................... 361/93.6
See application file for complete search history.

(56) References Cited

U.S. PATENT DOCUMENTS

| | | | |
|---|---|---|---|
| 4,264,675 A | 4/1981 | Liautaud | |
| 5,982,265 A | 11/1999 | Von Skarczinski et al. | |
| 8,518,535 B2* | 8/2013 | Fukuda | H01B 3/301 174/120 C |
| 2003/0179525 A1* | 9/2003 | Baginski | H01H 3/222 361/71 |
| 2006/0176140 A1 | 8/2006 | Skendzic et al. | |

(Continued)

FOREIGN PATENT DOCUMENTS

JP  04279639 A  * 10/1992

OTHER PUBLICATIONS

French Preliminary Search Report dated Aug. 30, 2016 in French Application 15 62390 filed on Dec. 15, 2015 (with English Translation of Categories of Cited Documents).

*Primary Examiner* — Zeev V Kitov
(74) *Attorney, Agent, or Firm* — Oblon, McClelland, Maier & Neustadt, L.L.P.

(57) ABSTRACT

A sensor for measuring current of the Rogowski-torus type including a carrier made of a magnetic materials and a secondary winding wound on the carrier in order to deliver an electrical signal representative of a current flowing in a conductor passing through the interior of the torus. The carrier is made essentially of a moulded rigid plastic material and includes at least one exterior recess distributed over the length of the body of the carrier. The recess includes at least two grooves that are separated by a partition. The protecting and measuring device and the electric circuit breaker include such a current sensor.

11 Claims, 3 Drawing Sheets

(56) References Cited

U.S. PATENT DOCUMENTS

| | | |
|---|---|---|
| 2007/0226989 A1 | 10/2007 | Skendzic et al. |
| 2008/0007249 A1 | 1/2008 | Wilkerson et al. |
| 2008/0048646 A1 | 2/2008 | Wilkerson et al. |
| 2013/0002208 A1* | 1/2013 | Rozenboim ........... H02J 7/0021 320/162 |
| 2014/0132249 A1 | 5/2014 | Loglisci |

* cited by examiner

SENSOR FOR MEASURING CURRENT OF THE ROGOWSKI-TORUS TYPE, PROTECTING AND MEASURING DEVICE AND ELECTRIC CIRCUIT BREAKER INCLUDING SUCH A SENSOR

TECHNICAL FIELD

The invention relates to a current measurement sensor of the Rogowski coil type comprising a former made of non-magnetic material and a secondary winding wound on the said former so as to supply an electrical signal representative of a current flowing in a conductor passing through the inside of the torus.

The invention also relates to an electrical measurement and protection device and an electrical breaker comprising such a sensor.

PRIOR ART

Rogowski coils are generally known in the field of power breakers equipped with electronic triggers. They are used for the quality of their linearity and wide measurement dynamic range since they do not comprise a magnetic circuit that can be saturated. Thus, the precision is directly linked to the regularity of the winding and to the cross-section of the sensor.

Examples of Rogowski coil sensors used in breakers are described in the patent applications EP2667205A1 and US2014132249A1. The U.S. Pat. No. 5,982,265 shows another Rogowski coil sensor with an oval cross-section.

The output signal from a Rogowski coil is given by the formula:

$$V = \mu n S di/dt$$

V being the voltage of the output signal supplied by the Rogowski coil,
S the cross-section of a turn,
$\mu_0$ the permeability
n is the number of turns, and
di/dt the derivative of a primary current with respect to time.

Thus, the voltage delivered by the toroidal coil is a function of the total surface area of the turns and the precision of the voltage is directly linked to the dimensional variations of the coil former.

According to the fabrication techniques, the winding formers for Rogowski coils are generally made with tubes made of flexible plastic material or by moulding of a rigid plastic element.

These rigid plastic elements have shapes that are stable and easily adapted to high-volume production. However, it is difficult to attain a measurement precision better than 1% without using a calibration system.

Furthermore, there is very little space available in the breakers and the ambient temperature dynamic range is very wide, for example from −40° C. when the breaker is operated in a hostile environment such as at high altitude or the arctic regions up to 180° C. for a breaker operating at nominal current in a hot environment such as in equatorial or tropical regions.

Such variations generate expansion effects or changes in size of the cross-section of the former which has repercussions on the precision of the output signal.

Moreover, during the fabrication, the contraction during the moulding phase is difficult to control with a solid former or a hollow former. This also contributes to altering the measurement whenever a high precision is sought for toroidal coils that are mass produced.

DESCRIPTION OF THE INVENTION

The goal of the invention is a very precise Rogowski coil sensor that can be mass produced and is virtually insensitive to variations in temperature, together with a protection device and a breaker comprising such a sensor.

According to the invention, in a current measurement sensor of the Rogowski coil type comprising a former made from non-magnetic material and a secondary winding wound on the said former in order to supply an electrical signal representative of a current flowing in a conductor passing through the inside of the torus, the said former is essentially made of moulded rigid plastic material and comprises at least one outer cut-out distributed over the length or the circumference of the body of the former, the said cut-out comprising at least two grooves separated by a partition.

Preferably, the said former has a cross-section having a quadrilateral shape with rounded corners, an inner face, an outer face, and two lateral faces.

Advantageously, at least one of the faces of the former comprises the said cut-out comprising at least two grooves separated by a partition. In particular, at least one of the two lateral faces of the former comprises at least two grooves separated by a partition. Preferably, the two lateral faces of the former comprise at least two grooves separated by a partition.

Preferably, the said cross-section of the toroidal coil former has a substantially trapezoidal shape with rounded corners. Advantageously, the inner face and the outer face of the former with a trapezoidal shape form a right angle plus or minus 8 to 20 degrees with respect to the two lateral faces.

Preferably, the former comprises ribs distributed along the grooves in order to maintain the partition.

In one particular embodiment, the former is composed of amorphous resin with a vitreous transition temperature higher than 200° C. Preferably, the said resin is charged with beads or glass fibres with a size of less than 200 µm. Preferably, the said resin is charged to between 20 and 50%.

An electrical measurement and protection device for a breaker comprising a processing unit for receiving signals representative of electrical current according to the invention comprises a measurement sensor such as defined hereinabove connected to the processing unit in order to supply a current signal representative of a current flowing in an electrical conductor.

An electrical breaker according to the invention comprising at least one main contact for interrupting a current in an electrical circuit, a mechanism for controlling the opening of the said electrical contact and a measurement and protection device supplying a control signal to the said control mechanism comprises a measurement sensor such as defined hereinabove connected to a processing unit of the said measurement and protection device.

BRIEF DESCRIPTION OF THE DRAWINGS

Other advantages and features will become more clearly apparent from the description that follows of particular embodiments of the invention, presented by way of non-limiting examples, and shown in the appended drawings, in which.

DETAILED DESCRIPTION OF EMBODIMENTS

Figure 1:
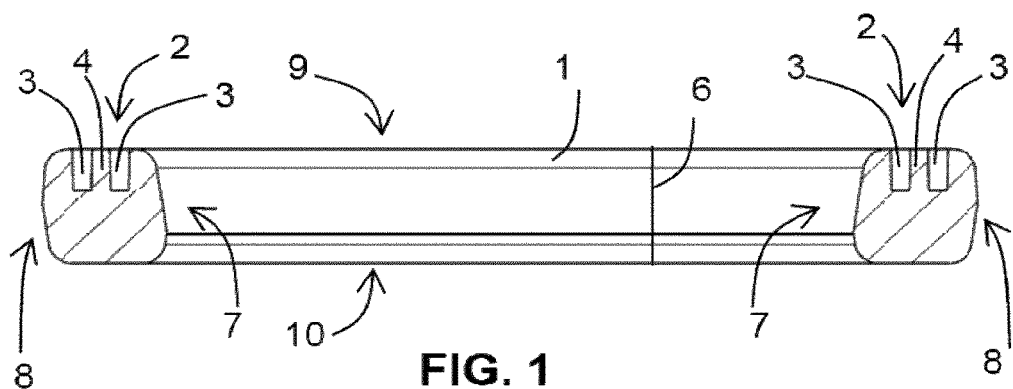
FIG. 1 shows a cross-sectional view of a toroidal coil former according to a first embodiment of the invention.

FIG. 1 shows a cross-sectional view of a toroidal coil former 1 according to a first embodiment of the invention. The former is made from non-magnetic material such as moulded rigid plastic. A secondary winding 5 will be wound onto the former in order to supply an electrical output signal from the Rogowski sensor. The winding covers the whole circumference of the former, however, in order to show the structure of the former, only one turn 6 is shown in FIG. 1. The said former 1 comprises at least one outer cut-out distributed over the length or the circumference of the body of the former. The said cut-out 2 comprise at least two grooves 3 separated by a partition 4.

The height of the partition 4 participates in the definition of the cross-section of the former and avoids the wire of the winding being squashed into the groove when the toroidal coil is handled. The said grooves are notably empty spaces used to localize the contraction of the plastic material during the moulding operation within a region that has no effect on the cross-section of the turns. Thus, the grooves allow the effect of the contraction of the plastic material after the moulding to be eliminated. With this cut-out, the variations in dimensions between the moulding phase and the finished product phase are greatly reduced.

The shape of the cross-section may be oval, round, but preferably with four faces corresponding to the sides of a quadrilateral. This shape facilitates the manipulation of the toroidal coil by an operator during the installation of the sensor into its protective housing and avoids the crushing of the wire of the winding of the secondary coil. Preferably, the angles of the quadrilateral are rounded in order to facilitate the winding of the wire onto the former.

Since the cross-section of the former has a quadrilateral shape with rounded corners, the said former has an inner face 7, an outer face 8, and two lateral faces 9 and 10 of the sensor.

Figure 2:
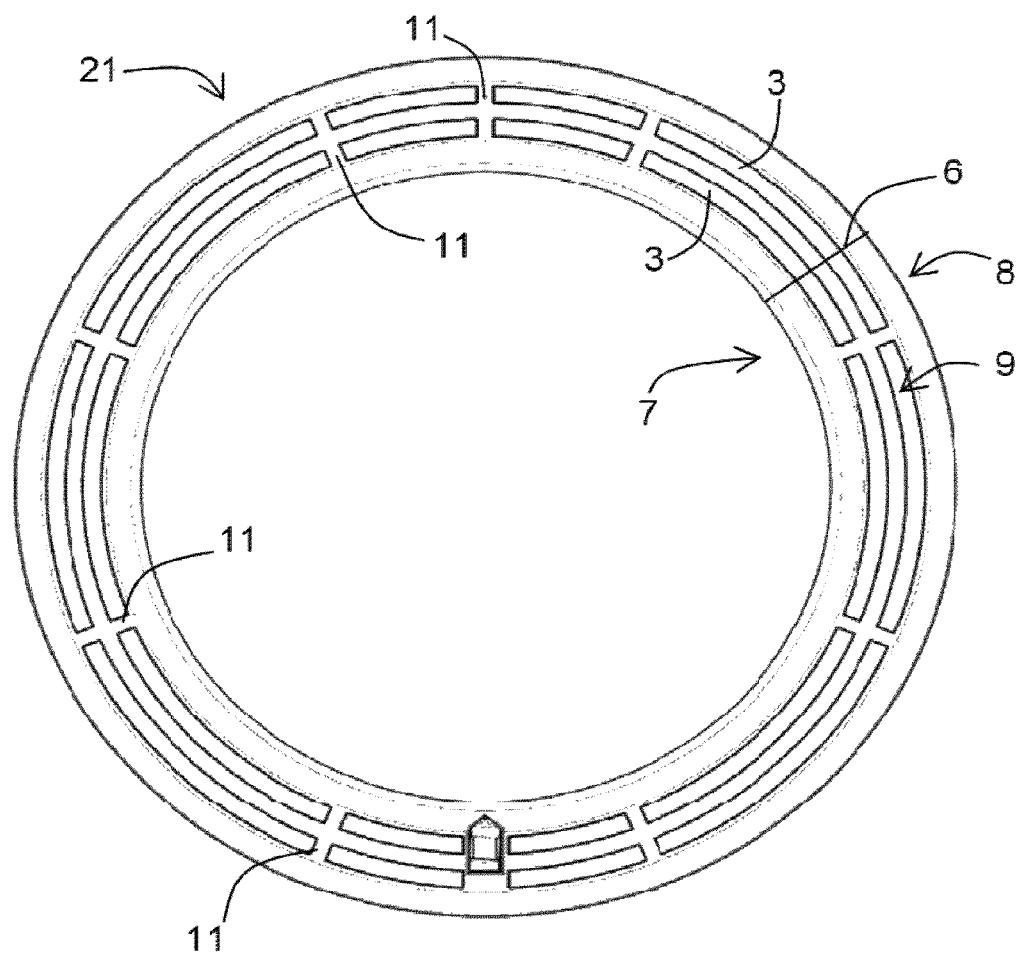
FIG. 2 shows a top view of the former in FIG. 1 according to a variant of the first embodiment of the invention.
Figure 3:
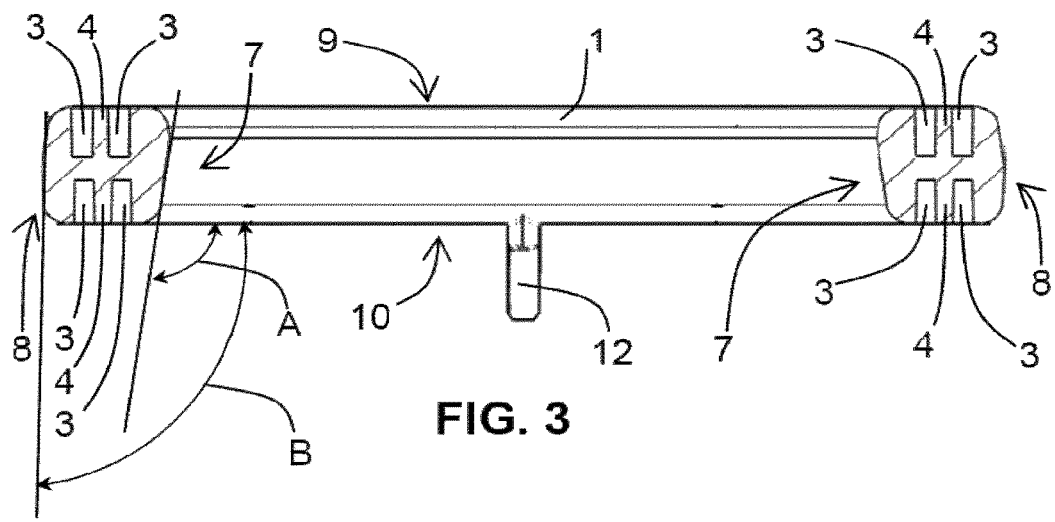
FIG. 3 shows a cross-sectional view of a toroidal coil former according to a second embodiment of the invention.
Figure 4:
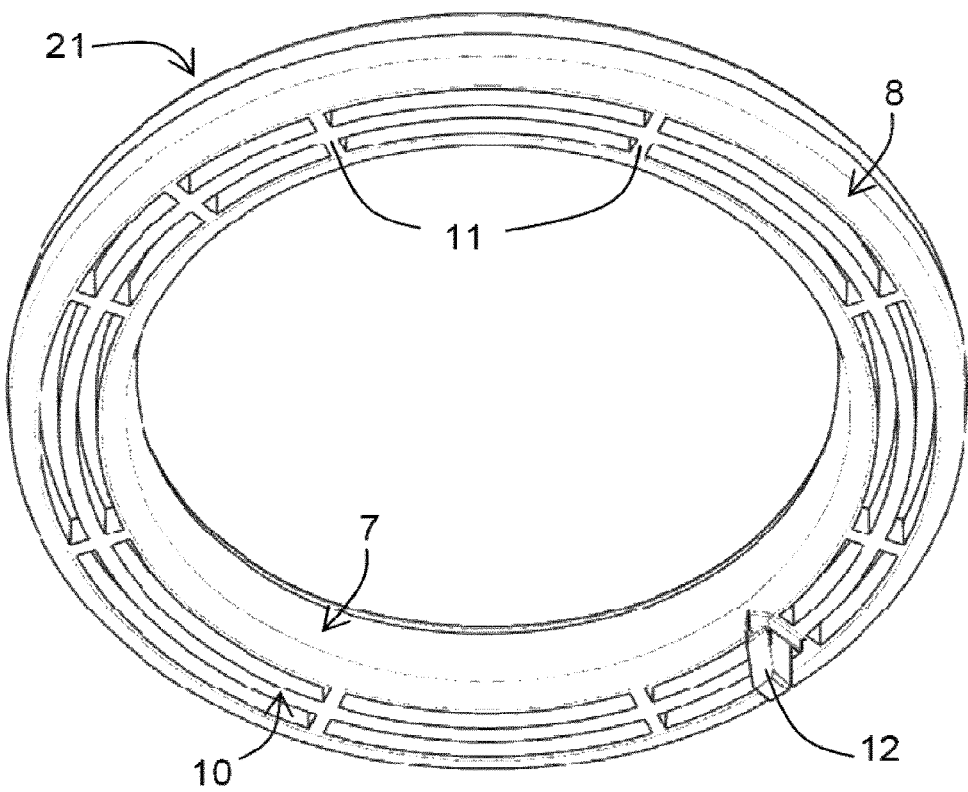
FIGS. 4 and 5 represent perspective views showing the top and the bottom of the former in FIG. 3 according to the second embodiment of the invention.
Figure 5:
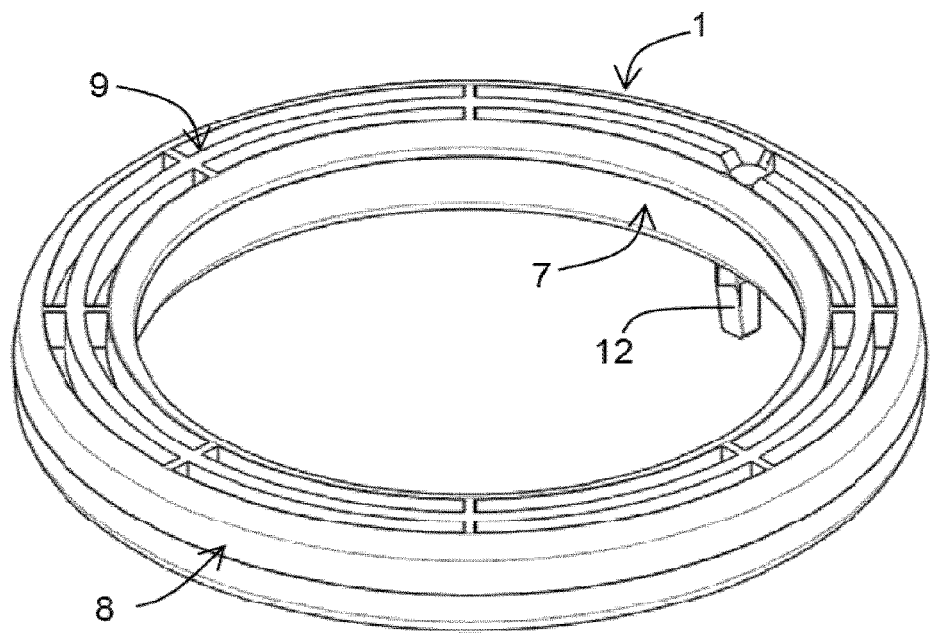

In the case of a former having a cross-section with a quadrilateral shape, at least one of the faces of the former of the sensor comprises the said cut-out comprising at least two grooves 3 separated by a partition 4. Preferably, at least one of the two lateral faces of the former of the sensor comprises at least two grooves separated by a partition. In FIGS. 1 and 2, the grooves are on the lateral face 9. In order to obtain even more precise results, the two lateral faces 9 and 10 of the former of the sensor comprise at least two grooves 3 separated by a partition 4. FIG. 3 shows a cross-sectional view of a toroidal coil former according to a second embodiment of the invention comprising grooves on the two lateral faces 9 and 10. FIGS. 4 and 5 show perspective views of the former according to the second embodiment of the invention. In these figures the former also comprises a lug 12 provided to hold the terminations of the secondary winding 5 when it is wound on the former 1.

In one particular case, the said cross-section of the former 1 with a quadrilateral shape has a substantially trapezoidal shape with rounded corners. The trapezoidal shape in particular allows the surface area of the turn to be optimized taking into account the location of the toroidal coil within a breaker. The lateral faces 9 and 10 are preferably parallel.

Preferably, the inner face and the outer face of the former of trapezoidal shape form a right angle A or B of 90 degrees plus or minus 8 to 20 degrees with respect to the lateral faces 9 and 10. The cross-section of the toroidal coil former of trapezoidal shape with an angle in the range between 5° and 20° allows the largest possible surface area to be obtained for a turn taking into account the mechanical constraints.

The top view of the former shown in FIG. 2 shows the two grooves 3 and the partition 4 present along the former of the toroidal coil on one of the lateral faces 9. In this embodiment, the former comprises ribs 11 distributed along the grooves 3 in order to maintain the partition 4.

In addition to limiting the contraction of the material by the shape of the former and the presence of outer grooves around the periphery of the said former, a sensor according to the invention preferably has a former composed of an amorphous resin with a vitreous transition temperature (Tg) higher than 200° C. The amorphous nature allows the contraction of the moulding to be substantially reduced and promotes a better dimensional control of the moulded element. Thus, such a material provides a constant and predictable CLTE (Coefficient of Linear Thermal Expansion) over a temperature range from −40° C. to 180° C. Since the coefficient of linear thermal expansion CLTE is very low, close to that of copper, it is possible to guarantee a high measurement precision ≤1% even in the case of variations in temperature.

Advantageously, the said resin of the former is charged with beads or glass fibres with a size of less than 200 μm. The charge or the reinforcement of the material allows the coefficient of linear thermal expansion CLTE to be reduced in order to reach a value close to that of the copper used for the winding of the secondary coil. In order to obtain a form factor close to 1, the beads or glass fibres will be ultra-short of the order of 50 μm to 100 μm. They will thus allow a virtually isotropic coefficient of linear thermal expansion CLTE to be obtained for the element in any direction. Preferably, the said resin is charged to between 20 and 50%, with a particular preference of around 30%.

Figure 6:
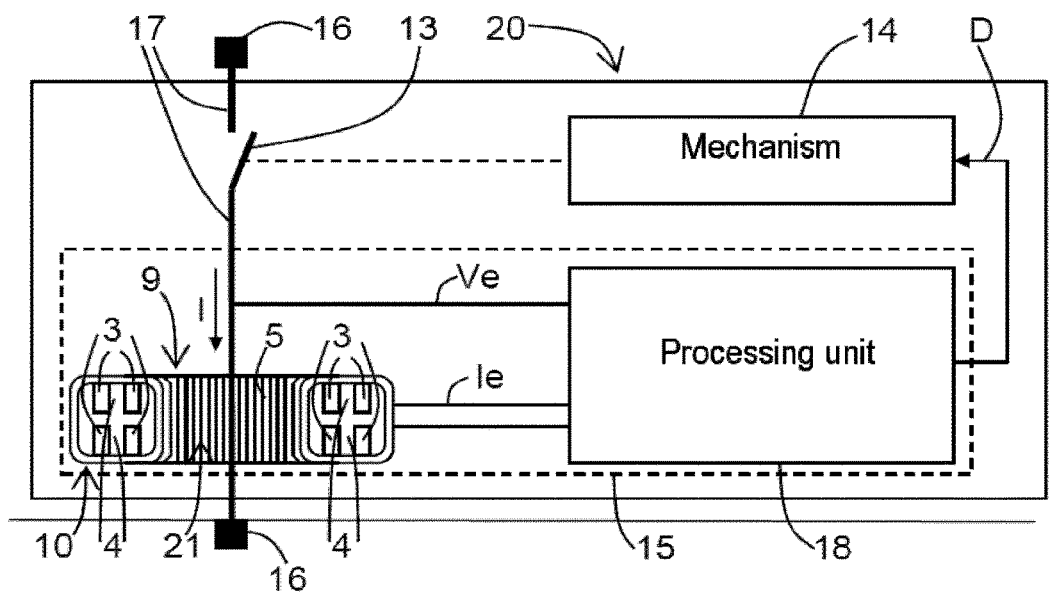
FIG. 6 shows a schematic diagram of an electrical breaker comprising a sensor according to one embodiment of the invention.

FIG. 6 shows a schematic diagram of an electrical breaker 20 comprising a sensor 20 according to one embodiment of the invention associated with a measurement and protection device. The electrical breaker 20 comprises at least one main contact 13 for interrupting a current I in an electrical circuit, a mechanism 14 for controlling the opening of the said electrical contact 13 and a measurement and protection device for supplying a control signal D to the said control mechanism 14. The breaker also comprises power electrical terminals 16 for connecting external electrical conductors and internal connecting conductors 17 between the main contact 13 and the terminals 16. At least one current sensor 21 such as described hereinabove is disposed around a primary conductor 17 of the breaker such as a connecting conductor 17 between a terminal 16 and a main contact 13. The current sensor 21 is connected to a processing unit 18 of the measurement and protection device 15 in order to supply signals I-e representative of an electrical current flowing in the primary conductor I. Thus, the processing unit receives signals I-e representative of electrical current from the sensor 21, carries out the processing of the current signals, performs the protection and signalling functions and, if necessary, supplies a trigger signal or command D to the mechanism 14 for opening the contacts 13 of the breaker.

In the breaker in FIG. 6, the sensor 21 has a former 1 according to the second embodiment of the invention with cut-outs on the lateral faces 9 and 10, each cut-out comprising two grooves 3 and a partition 4. The secondary winding 5 is connected to an input of the processing unit 18 in order to supply the current measurement signal I-e. The processing unit may also receive a voltage measurement signal V-e from the primary conductor 17. In this case, the processing unit may also carry out the processing and the calculation of the energy and/or the electrical power with a very high precision.

In FIG. 6, a breaker with only one phase or pole is shown. However, the invention is also applicable to multipolar breakers, notably to three-phase breakers. In this case, each protected pole comprises a current sensor such as defined hereinabove.

The measurement and protection device 15, comprising the sensor 21 and the processing unit 18, may be an electronic trigger for a breaker but also a relay or a protection module and/or power and/or electrical energy measurement module.

The invention claimed is:

1. A Rogowski current measurement sensor comprising a former made from non-magnetic material and a secondary winding wound on said former in order to supply an electrical signal representative of a current flowing in a conductor passing through the inside of a torus,
wherein said former is made essentially of a moulded rigid plastic material and comprises at least one outer cut-out distributed over the length or the circumference of the body of the former, said cut-out comprising at least two grooves separated by a partition,
wherein said cross-section of the toroidal coil former has a substantially trapezoidal shape with rounded corners, an inner face, an outer face, and two lateral faces, where each of the inner face and the outer face of the former of trapezoidal shape form an angle, that is offset from being a right angle, with respect to the lateral faces.

2. The current measurement sensor according to claim 1, wherein at least one of the faces of the former comprises the said cut-out comprising at least two grooves separated by a partition.

3. The current measurement sensor according to claim 1, wherein at least one of the two lateral faces of the former comprises at least two grooves separated by a partition.

4. The current measurement sensor according to claim 1, wherein the two lateral faces of the former comprise at least two grooves separated by a partition.

5. The current measurement sensor according to claim 1, wherein the inner face and the outer face of the former of trapezoidal shape each form a respective angle that is offset 8 to 20 degrees from a right angle with respect to the lateral faces.

6. The current measurement sensor according to claim 1, wherein the former comprises ribs distributed along the grooves in order to maintain the partition.

7. The current measurement sensor according to claim 1, wherein the former is composed of amorphous resin with a vitreous transition temperature higher than 200° C.

8. The current measurement sensor according to claim 7, wherein said resin is charged with beads or glass fibres with a size of less than 200 μm.

9. The current measurement sensor according to claim 7, wherein said resin is charged to between 20 and 50%.

10. An electrical measurement and protection device for a breaker comprising a processing unit for receiving signals representative of electrical current, wherein a measurement sensor according to claim 1 connected to the processing unit in order to supply a current signal representative of a current flowing in an electrical conductor.

11. The electrical breaker comprising at least one main contact for interrupting a current in an electrical circuit, a mechanism for controlling the opening of the said electrical contact and a measurement and protection device supplying a control signal to the said control mechanism wherein a measurement sensor according to claim 1 connected to a processing unit of the said measurement and protection device.

* * * * *